May 29, 1962 R. H. RUGABER ET AL 3,037,130

PULSE AMPLIFIER UTILIZING THE STORAGE EFFECT OF A TRANSISTOR TO FORM A SQUARE PULSE OUT FROM A DIFFERENTIATED PULSE INPUT

Filed March 2, 1959 2 Sheets-Sheet 1

INVENTOR.
ROBERT H. RUGABER
JOHN L. WHEELER
BY STEPHEN E. TOWNSEND
Richard G. Stahr
ATTORNEY United States Patent Office 3,037,130

Patented May 29, 1962

3,037,130

PULSE AMPLIFIER UTILIZING THE STORAGE EFFECT OF A TRANSISTOR TO FORM A SQUARE PULSE OUT FROM A DIFFERENTIATED PULSE INPUT

Robert H. Rugaber, Rochester, John L. Wheeler, Webster, and Stephen E. Townsend, Rochester, N.Y., assignors to General Dynamics Corporation, Rochester, N.Y., a corporation of Delaware Filed Mar. 2, 1959, Ser. No. 796,476
1 Claim. (Cl. 307—88.5)

This invention relates to pulse amplifier circuits and, more specifically, to a pulse amplifier circuit including a novel final stage input coupling circuit.

In a variety of applications in digital data communication and switching circuits, it is necessary to supply short pulses for the purpose of driving pulse sensitive circuits, such as shift registers or binary counters. Many of these pulse sensitive circuits require the application thereto of pulses having a narrow width with high current and voltage characteristics. In transistorized circuitry, it has been found that power transistors are required to produce pulses with the required high current and voltage characteristics. However, power transistor devices have inherently poor high-frequency response, that is, a relatively long build-up and cut-off period. To obtain the required narrow pulse width from a power transistor, therefore, it has been found that something other than the conventional method of driving these transistors is required.

It is accordingly an object of this invention to provide an improved pulse amplifier circuit.

It is another object of this invention to provide an improved pulse amplifier circuit which will produce output pulses of relatively narrow width and high current and potential characteristics.

In accordance with this invention, the input coupling circuit to the final stage of a pulse amplifier is comprised of a core of magnetizable material having relatively square hysteresis loop characteristics and including input coupling windings for connection to a source of signal pulses and output coupling windings for connection to the final stage amplifier device.

Figure 1:
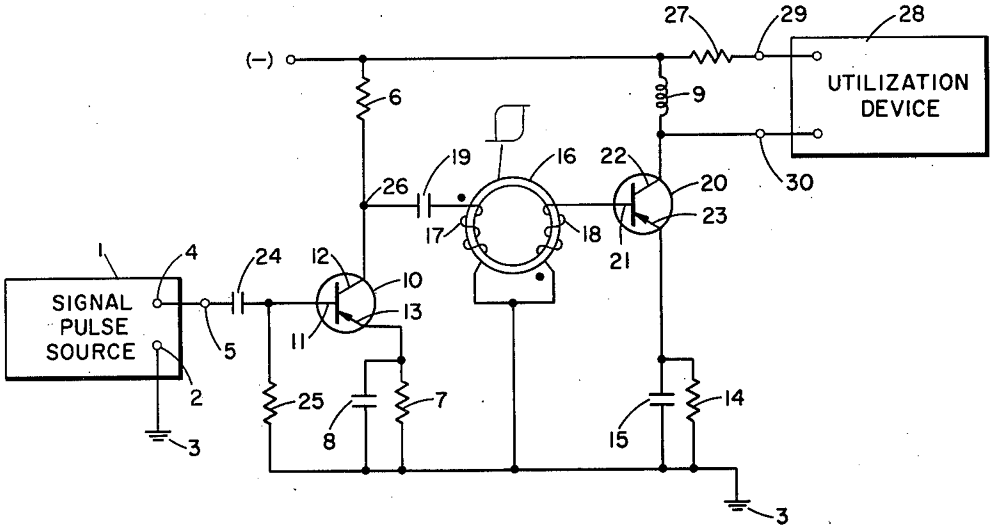
Figure 2:
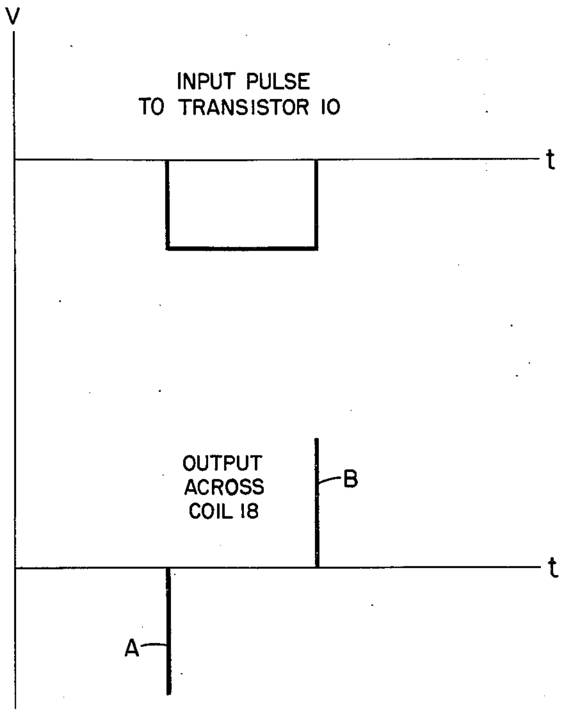

For a better understanding of the present invention, together with further objects, advantages and features thereof, reference is made to the following description and accompanying FIGURE 1 drawing which illustrates a preferred embodiment of this invention and FIGURE 2 which shows a voltage-time curve.

A source of signal pulses, for example, an oscillator, is illustrated in block form by reference numeral 1 inasmuch as details of suitable sources are well known in the art and form no part of this invention. One terminal 2 of pulse source 1 is connected to point-of-reference potential 3, while the other terminal 4 of pulse source 1 is connected to the pulse amplifier of this invention through input terminal 5.

The preferred embodiment of this invention utilizes two transistor devices indicated by reference numerals 10 and 20, where transistor 20 is a power transistor capable of producing an output pulse having relatively high current and potential characteristics but which produces a relatively wide pulse in that it possesses poor high frequency response characteristics. Each of transistors 10 and 20 have the usual base, emitter and collector electrodes which are indicated by reference numerals 11, 12 and 13, respectively, for transistor 10 and reference numerals 21, 22 and 23, respectively, for transistor 20.

Transistor 10 has herein been illustrated as a type P-N-P transistor and is connected across an operating potential source, not shown, from the negative terminal thereof, through collector resistor 6, emitter resistor 7 and point-of-reference potential 3, as indicated. The usual emitter by-pass capacitor is herein illustrated by reference numeral 8. Transistor 20 is similarly connected across the source of operating potential through collector coil 9, emitter resistor 14, and point-of-reference potential 3, as indicated. Again, the usual emitter by-pass capacitor is illustrated by reference numeral 15.

The input coupling circuit to the final stage amplifier device 20 of the preferred embodiment of this invention comprises a magnetic core 16, input coupling winding 17 and output coupling winding 18. The input coupling winding 17 thereof is coupled through coupling capacitor 19 to the output circuit of transistor 10 which, in this instance, may be considered as a signal pulse source, while output coupling winding 18 is connected to the base-emitter input circuit of the final stage transistor 20, as indicated.

To complete the connections, the signal pulse source 1 is connected to the input circuit of transistor 10 through input circuit terminal 5 and input circuit network comprised of capacitor 24 and resistor 25.

In the normal state, the base 11 of transistor 10 is at substantially the same potential as the emitter 13 of transistor 10, thereby rendering transistor 10 nonconductive in that this does not satisfy the base-emitter bias requirements for conduction through a type P-N-P transistor which requires that the base be biased negatively in respect to the emitter. Therefore, to render transistor 10 conductive, the signal pulses emanating from source 1, one of which is shown in FIGURE 2, must be negative-going which, when applied to the base 11 of transistor 10 through coupling capacitor 24, will bias the base 11 negatively in respect to the emitter 13, thereby rendering transistor 10 conductive.

As transistor 10 conducts upon the application of a negative-going pulse thereto, the potential at point 26 proceeds in a positive direction from a negative potential substantially equal to the supply potential to substantially ground potential as determined by the resistance value of emitter resistor 7.

This positive-going pulse is applied to the input winding 17 of core 16 through coupling capacitor 19 and induces a potential A, shown in FIGURE 2, in output coupling winding 18 which is poled in such a manner that the potential induced therein is negative-going. As the core 16 is composed of a magnetizable material having relatively square hysteresis loop characteristics, the negative pulse A induced in output coupling winding 18 possesses a nearly vertical wave front which drives the base 21 of transistor 20 sharply negative in respect to the emitter 23 of transistor 20. As this condition satisfies the base-emitter bias requirements for conduction through a type P-N-P transistor, transistor 20 is sharply rendered conductive which produces an emitter-collector current wave possessing a nearly vertical wave front.

As the signal pulse emanating from source 1 is removed from the base 11 of transistor 10, transistor 10 is rendered nonconductive in that the base 11 is again at substantially the same potential as the emitter 13, a condition which does not satisfy the base-emitter bias requirements for conduction through a type P-N-P transistor. As transistor 10 is rendered nonconductive, the potential of point 26 proceeds negatively from a potential near ground potential to a negative potential substantially equal to the supply potential. At this time, coupling capacitor 19 rapidly charges through input coupling winding 17 of core 16 and resistor 6 in a negative direction, thereby inducing a pulse B, shown in FIGURE 2, which is positive-going in output coupling winding 18. Again, as the magnetic core 16 is composed of a magnetizable material having relatively square hysteresis loop characteristics, the positive-going pulse B induced in output coupling winding 18 has a nearly vertical wave front which, when applied to the base 21 of transistor 20, biases the base 21 sharply positive in respect to the emitter 23, thereby sharply rendering transistor 20 nonconductive in that this condition does not satisfy the base-emitter bias requirements for conduction through a type P-N-P transistor. At this time, the emitter-collector current wave produced by transistor 20 is sharply returned toward zero. Therefore, the current wave of transistor 20 has a rapid rise and fall time which produces a corresponding potential pulse across resistor 27. This potential pulse may be applied to a utilization device, the details of which form no part of this invention and which is illustrated in block form by reference numeral 28, through output circuit terminals 29 and 30, as indicated. For purposes of temperature compensation, collector coil 9 may be inserted, as indicated; however, this coil may or may not be required, depending upon the application of the novel pulse amplifier of this invention.

While a two-stage amplifier has been illustrated in the preferred embodiment just described, it is to be specifically understood that a source of pulses having sufficient magnitude as to not require a stage of preamplification may be applied to the input coupling circuit of transistor 20 through a terminal connected at point 26. Similarly, the preferred embodiment has herein illustrated transistors 10 and 20 to be type P-N-P transistors. It is also to be specifically understood that type N-P-N transistors may also be employed with the corresponding changes in potential requirements.

While a preferred embodiment of this invention has been shown and described, it will be obvious to those skilled in the art that various modifications and substitutions may be made without departing from the spirit of this invention which is to be limited only within the scope of the appended claim.

What is claimed is:

A device comprising a pulse power amplifier including a power transistor having inherently poor high frequency response characteristics, whereby the inherent storage time of said pulse power amplifier is relatively long, said power transistor being normally nonconducting, an input pulse source producing a pulse which has a pulse width which is short relative to the inherent storage time of said power transistor, and input coupling means including a core of magnetizable material having relatively square hysteresis loop characteristics, said core having an input winding coupled to said pulse source and having an output winding coupled directly as an input to said power transistor for rendering said power transistor conducting in response to a sharp pip of a given polarity induced in said output winding by the leading edge of a pulse applied to said input winding, said power transistor being maintained conducting for the duration of said pulse by its inherently long storage time, and for rendering said power transistor nonconducting in response to a sharp pip of a polarity opposite to said given polarity induced in said output winding by the lagging edge of said pulse applied to said input winding.

References Cited in the file of this patent

UNITED STATES PATENTS

| | | |
|---|---|---|
| 2,610,246 | Goldsmith | Sept. 9, 1952 |
| 2,659,019 | Clayton | Nov. 10, 1953 |
| 2,695,993 | Hayes | Nov. 13, 1954 |
| 2,866,178 | Lo | Dec. 23, 1958 |
| 2,900,508 | Tillman | Aug. 18, 1959 |
| 2,905,815 | Goodrich | Sept. 22, 1959 |
| 2,915,649 | Cagle | Dec. 1, 1959 |
| 2,946,899 | Day | July 26, 1960 |
| 2,959,687 | Eckert | Nov. 8, 1960 |

OTHER REFERENCES

Junction Transistor Electronics, by Hurley, pp. 363–367.